US012588279B2

(12) United States Patent
Zhang et al.

(10) Patent No.: US 12,588,279 B2
(45) Date of Patent: Mar. 24, 2026

(54) ARRAYED SWITCH CIRCUITRY SYSTEM AND SWITCHING CIRCUIT

(71) Applicant: INDUSTRIAL TECHNOLOGY RESEARCH INSTITUTE, Hsinchu (TW)

(72) Inventors: Jie Zhang, New Taipei City (TW); Sih-Han Li, New Taipei City (TW)

(73) Assignee: INDUSTRIAL TECHNOLOGY RESEARCH INSTITUTE, Hsincu (TW)

( * ) Notice: Subject to any disclaimer, the term of this patent is extended or adjusted under 35 U.S.C. 154(b) by 573 days.

(21) Appl. No.: 17/678,853

(22) Filed: Feb. 23, 2022

(65) Prior Publication Data

US 2022/0310657 A1 Sep. 29, 2022

Related U.S. Application Data

(60) Provisional application No. 63/166,833, filed on Mar. 26, 2021.

(30) Foreign Application Priority Data

Nov. 10, 2021 (TW) ................................. 110141770

(51) Int. Cl.
*H10D 84/90* (2025.01)

(52) U.S. Cl.
CPC ......... *H10D 84/907* (2025.01); *H10D 84/938* (2025.01); *H10D 84/948* (2025.01); *H10D 84/975* (2025.01)

(58) Field of Classification Search
CPC ..... H01L 27/11807; H01L 2027/11838; H01L 2027/11848; H01L 2027/11875
(Continued)

(56) References Cited

U.S. PATENT DOCUMENTS

| | | | |
|---|---|---|---|
| 6,084,429 A | 7/2000 | Trimberger | |
| 6,294,929 B1 | 9/2001 | Coulman | |

(Continued)

FOREIGN PATENT DOCUMENTS

| | | | |
|---|---|---|---|
| CN | 101753011 | * | 6/2010 |
| CN | 103312309 | * | 9/2013 |

(Continued)

OTHER PUBLICATIONS

Reszewicz et al., "2.4 GHz LC-VCO with improved robustness against PVT using FD-SOI body biasing technique" 2018.
(Continued)

*Primary Examiner* — Sheng-Bai Zhu
(74) *Attorney, Agent, or Firm* — Maschoff Brennan

(57) ABSTRACT

An arrayed switch circuitry includes contact units each of which includes a pad, a first row channel provided with a first switching element, a first column channel connected to the first row channel and provided with a second switching element, a connecting channel connecting the pad to the first row channel or the first column channel, a second row channel connected with the pad through a third switching element and a second column channel connected with the pad through a fourth switching element. The first row channels with the same row position are connected to each other, and the second row channels with the same row position are connected to each other. The first column channels with the same column position are connected to each other, and the second column channels with the same column position are connected to each other.

7 Claims, 10 Drawing Sheets

(58) Field of Classification Search
USPC .......................................................... 257/203
See application file for complete search history.

(56) References Cited

U.S. PATENT DOCUMENTS

| | | | |
|---|---|---|---|
| 6,469,540 B2 | 10/2002 | Nakaya | |
| 6,788,562 B2 | 9/2004 | Nishizaka | |
| 7,405,588 B2 | 7/2008 | Kawahara | |
| 8,878,566 B2 | 11/2014 | Nakaya | |
| 9,106,229 B1 | 8/2015 | Hutton et al. | |
| 9,214,932 B2 | 12/2015 | Clausen | |
| 9,842,784 B2 | 12/2017 | Nasrullah | |
| 2006/0233058 A1* | 10/2006 | Yoshikawa | H04N 7/22 369/1 |
| 2014/0320464 A1* | 10/2014 | Ryu | G09G 3/3688 345/204 |
| 2015/0379907 A1* | 12/2015 | Liu | G02F 1/1309 345/87 |
| 2015/0381171 A1 | 12/2015 | Cebi | |
| 2017/0062294 A1 | 3/2017 | Nasrullah | |
| 2017/0255167 A1* | 9/2017 | Yamazaki | H03B 5/364 |
| 2017/0272066 A1 | 9/2017 | Scott | |
| 2019/0340994 A1* | 11/2019 | Chen | G09G 3/3688 |
| 2020/0295707 A1* | 9/2020 | Itasaka | H03K 3/356017 |
| 2021/0173000 A1* | 6/2021 | Tai | H04B 3/46 |

FOREIGN PATENT DOCUMENTS

| | | | | |
|---|---|---|---|---|
| CN | 103929056 | * | 7/2014 | |
| CN | 109473136 | * | 3/2019 | |
| CN | 110289225 A | | 9/2019 | |
| DE | 102012207068 | * | 10/2012 | |
| JP | 2003229748 | * | 9/2017 | H03B 5/364 |
| JP | H09252241 | * | 9/2020 | H03K 3/356017 |
| TW | 303069 B | | 11/2008 | |
| TW | I463651 B | | 12/2014 | |
| TW | I653639 B | | 3/2019 | |

OTHER PUBLICATIONS

Wang et al., "A 0.65 mW 2.3-2.5GHz low phase noise LC-VCO with adaptive body biasing technique" Nov. 2011.

Iijima el al., "A Technique for High-Speed Circuits on SOI Using Look-Ahead Type Active Body Bias Control" 2004

Tsu et al., "Compact Layout of DT-MOS Transistor With Source-Follower Subcircuit in 90-nm CMOS Technology" Apr. 2008.

Lai et al. "Low Power Class-C VCO Using Dynamic Body Biasing" 2017.

Taiwan Office Action dated Jun. 27, 2022 as received in application No. 110141770.

* cited by examiner

ARRAYED SWITCH CIRCUITRY SYSTEM AND SWITCHING CIRCUIT

CROSS-REFERENCE TO RELATED APPLICATIONS

This non-provisional application claims priority under 35 U.S.C. § 119(a) on Patent Application No(s). 63/166,833 filed in US on Mar. 26, 2021 and Patent Application No(s). 110141770 filed in Republic of China (ROC) on Nov. 10, 2021, the entire contents of which are hereby incorporated by reference.

BACKGROUND

1. Technical Field

This disclosure relates to an arrayed switch circuitry system and switching circuit, and particularly to an arrayed switch circuitry system and switching circuit applicable to system packaging.

2. Related Art

System packaging is packing a number of chips into one integrated circuit (IC). In current system packaging, connection between chips and connection of input/output pins of the package are routed through wiring redistribution layer (RDL). When the wiring design of RDL is completed, the packaging factory performs manufacturing and packaging, and after the packaging is completed, the package is handed over to the testing factory for integrated circuit testing. Since all the wiring redistribution layers are customized by the packaging factory, the wiring redistribution layers may have to be redesigned when the packaged integrated circuit is tested by the testing factory and it is discovered that the wiring of the wiring redistribution layer needs to be modified, or when the chip in the integrated circuit needs to be replaced, which increases the product research-and-development time and research-and-development cost. In addition, when encountering products with less quantity demand, the packaging factory tends to have a lower willingness to take orders.

SUMMARY

According to one or more embodiment of this disclosure, an arrayed switch circuitry system includes a number of contact units arranged as an array, wherein each of the contact units includes: a pad; a first row channel provided with a first switching element; a first column channel connected to the first row channel and provided with a second switching element; a connecting channel connected the pad to the first row channel or the first column channel; a second row channel connected to the pad through a third switching element; and a second column channel connected to the pad through a fourth switching element; wherein the first row channel of each of the contact units with the same row position is connected to each other, the second row channel of each of the contact units with the same row position is connected to each other, the first column of each of the contact units with the same column position is connected to each other, and the second column channel of each of the contact units with the same column position is connected to each other.

According to one or more embodiment of this disclosure, a switching circuit, includes: a transmission gate having an input end, an output end, two gate control ends and two base control ends, and configured to make the input end and the output end conduct or not conduct with each other according to voltages of the two gate control ends; and a base voltage control sub-circuit connected to the input end and the two base control ends, and configured to adjust voltages of the two base control ends according to a voltage of the input end when the input end and the output end conduct with each other, for a voltage difference between the input end and the two base control ends to be smaller than a default value.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. According to the description, claims and the drawings disclosed in the specification, one skilled in the art may easily understand the concepts and features of the present invention. The following embodiments further illustrate various aspects of the present invention, but are not meant to limit the scope of the present invention.

Figure 1:
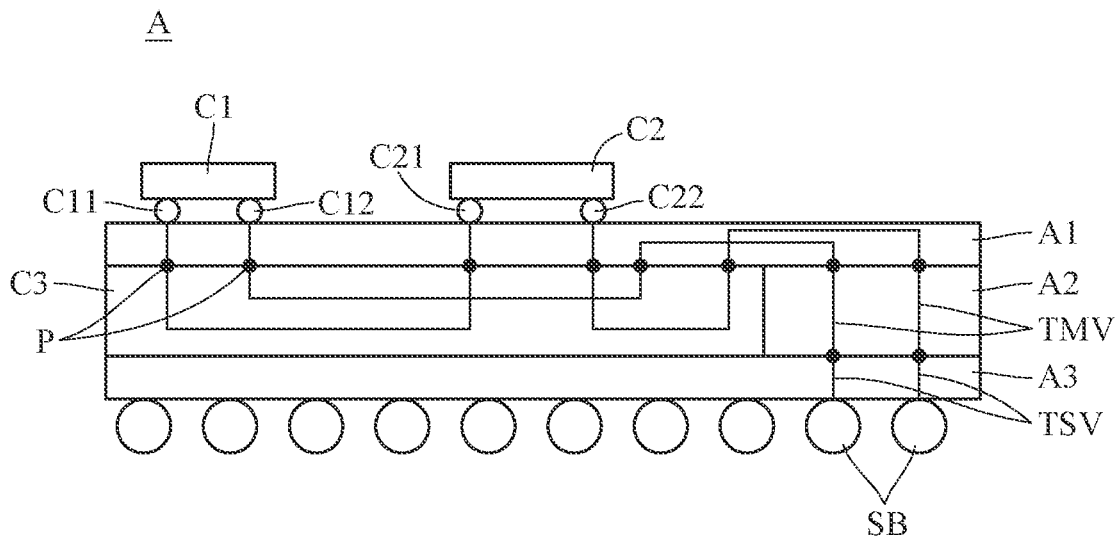
FIG. 1 is a schematic structural diagram illustrating a system package according to an embodiment of the present disclosure.

Please refer to FIG. 1. FIG. 1 is a schematic structural diagram illustrating a system package A according to an embodiment of the present disclosure. As shown in FIG. 1, the system package A includes a first chip C1, a second chip C2, a redistribution layer (RDL) A1, a connecting chip C3, a through mold via (TMV) layer A2, a through silicon via (TSV) layer A3 and a ball grid array (BGA) formed of a number of solder balls SB, wherein the connecting chip C3 and the through mold via layer A2 are disposed between the redistribution layer A1 and the through silicon via layer A3, the first chip C1 and the second chip C2 are disposed on a surface of the redistribution layer A1 opposite to another surface of the redistribution layer A1 provided with the connecting chip C3 and the through mold via layer A2, and the solder balls SB are disposed on a surface of the through silicon via layer A3 opposite to another surface of the through silicon via layer A3 provided with the connecting chip C3 and the through mold via layer A2.

The first chip C1 has a number of pins C11 and C12, and the second chip C2 has a number of pins C21 and C22. The redistribution layer A1 may include a number of wiring lines not connected with each other. The connecting chip C3 includes an arrayed switch circuitry system, wherein the arrayed switch circuitry system includes a number of pads and a number of switching elements, and the switching elements may be controlled to conduct channels between different combinations of the pads. That is, the connecting chip C3 is a programmable connecting chip. The detailed structure of the arrayed switch circuitry system of the connecting chip C3 is described below. The through mold via layer A2 includes a number of through mold vias TMV. The through silicon via layer A3 includes a number of through silicon vias TSV. The pins C11 and C12 of the first chip C1 and the pins C21 and C22 of the second chip C2 may be connected to the pads P of the connecting chip C3 at different locations respectively through a number of wiring lines of the redistribution layer A1. The switching elements of the connecting chip C3 are controlled to conduct the pad connected to the pin C11 and the pad connected to the pin C21, and to conduct the pad connected to the pin C12 and the pad connected to another wiring line (the first wiring line) in the redistribution layer A1, and conduct the pad connected to the pin C22 and the pad connected to yet another wiring line (the second wiring line) in the redistribution layer A1. The first and second wiring lines are then connected to the solder balls SB respectively through the through mold vias TMV in the through mold via layer A2 and the through silicon vias TSV in the through silicon via layer A3.

The conductive paths shown in FIG. 1 are merely examples. The switching elements in the connecting chip C3 may also be controlled to conduct channels between different pads accompanied with the redistribution layer A1 to provide other types of wiring combinations. That is, the wiring redistribution layer with single wiring design accompanying with the connecting chip may provide various wiring combinations. Accordingly, for different types of chip system packages, there may be no need to design various wiring redistribution layers with different wiring lines, thereby reducing the research-and-development time and research-and-development cost of product. In addition, the number of pins, the number of wiring lines and the number of via holes shown in FIG. 1 are exemplary, and not limited in the present disclosure.

Figure 2:
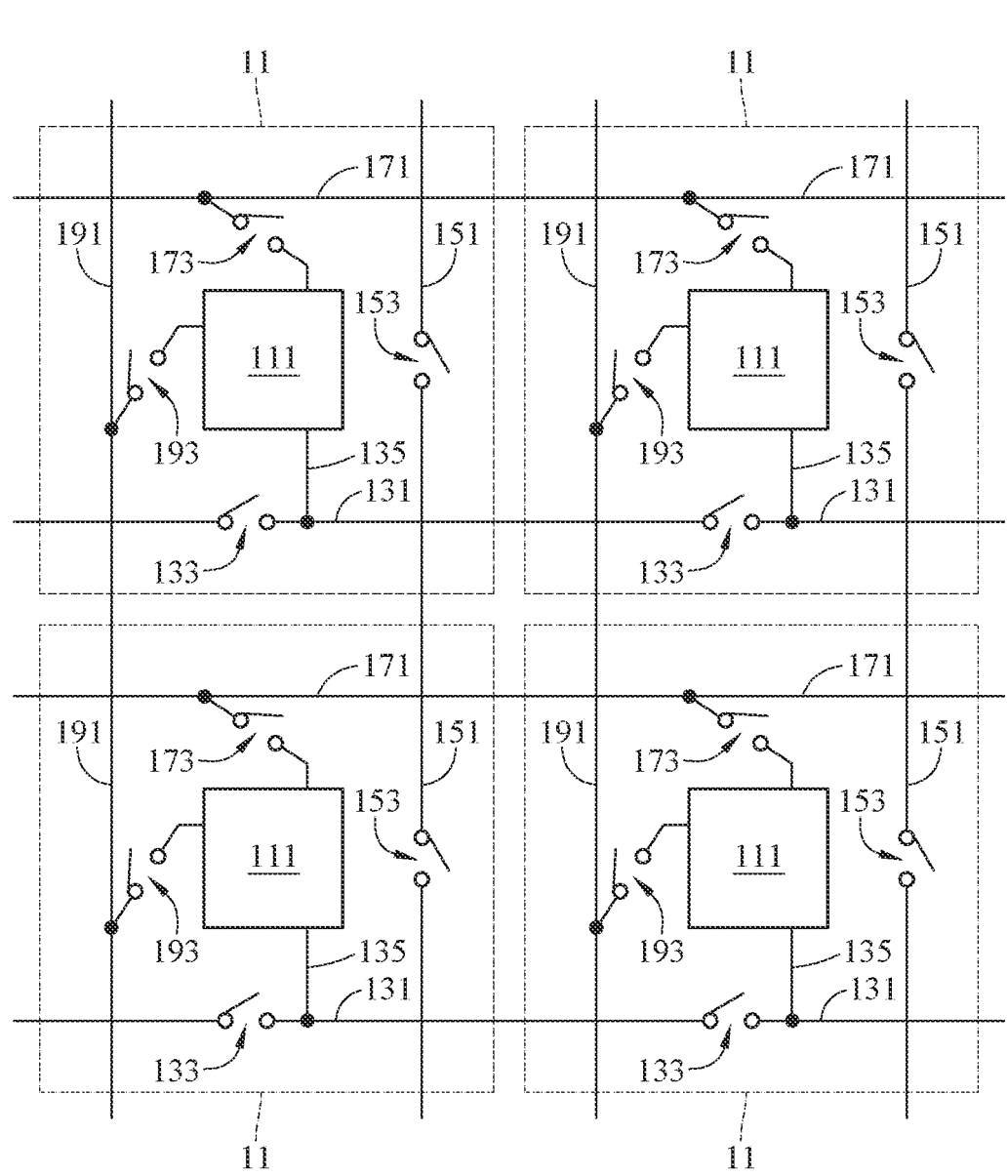
FIG. 2 is a schematic diagram illustrating an arrayed switch circuitry system according to an embodiment of the present disclosure.

In the following, a number of embodiments of structures of the arrayed switch circuitry system of the connecting chip C3 are described. Please refer to FIG. 2. FIG. 2 is a schematic diagram illustrating an arrayed switch circuitry system 1 according to an embodiment of the present disclosure. As shown in FIG. 2, the arrayed switch circuitry system 1 includes a number of contact units 11 arranged as an array, with each of the contact units 11 including a pad 111, a first row channel 131, a first column channel 151, a connecting channel 135, a second row channel 171 and a second column channel 191, wherein said channels may be implemented by wires.

The first row channel 131 is provided with a first switching element 133. The first column channel 151 is connected to the first row channel 131 and is provided with a second switching element 153. The connecting channel 135 connects the pad 111 to the first row channel 131 or the first column channel 151. FIG. 2 shows the connecting channel 135 connecting the pad 111 to the first row channel 131 as an example. The second row channel 171 is connected to the pad 111 through a third switching element 173. The second column channel 191 is connected to the pad 111 through a fourth switching element 193. In the array, each contact unit 11 has a row position and a column position, wherein the first row channels 131 of the contact units 11 with the same row position are connected to each other, the second row channels 171 of the contact units 11 with the same row position are connected to each other, the first column channels 151 of the contact units 11 with the same column position are connected to each other, and second third column channels 191 of the contact units 11 with the same column position are connected to each other.

In particular, the first row channel 131, the first switching element 133, the first column channel 151, the second switching element 153 and the connecting channel 135 of the contact unit 11 may jointly form a checkerboard structure, and the second row channel 171, the third switching element 173, the second column channel 191 and the fourth switching element 193 of the contact unit 11 may jointly form a high speed channel structure. The checkerboard structure is applicable to general signal transmission, and the high speed channel structure is applicable to signal transmission between the contact units 11 spaced far apart from each other (for example, two contact units 11 with more than five contact units 11 placed in between), or applicable to signal transmission requiring high-speed transmission. That is, the arrayed switch circuitry system 1 integrates two types of structures, which are the checkerboard structure and the high speed channel structure, and an optimal selection may be made according to the signal characteristics.

Figure 3A:
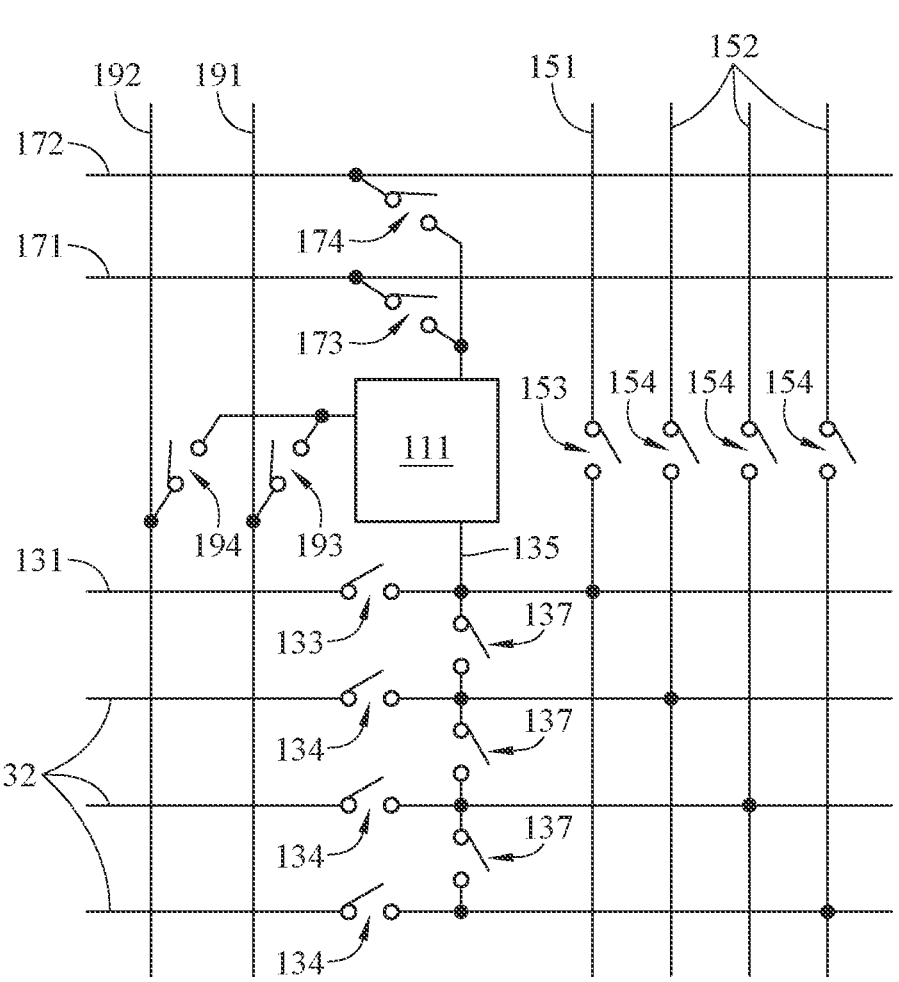
FIG. 3A is a schematic diagram illustrating a contact unit in an arrayed switch circuitry system according to another embodiment of the present disclosure.
Figure 3B:
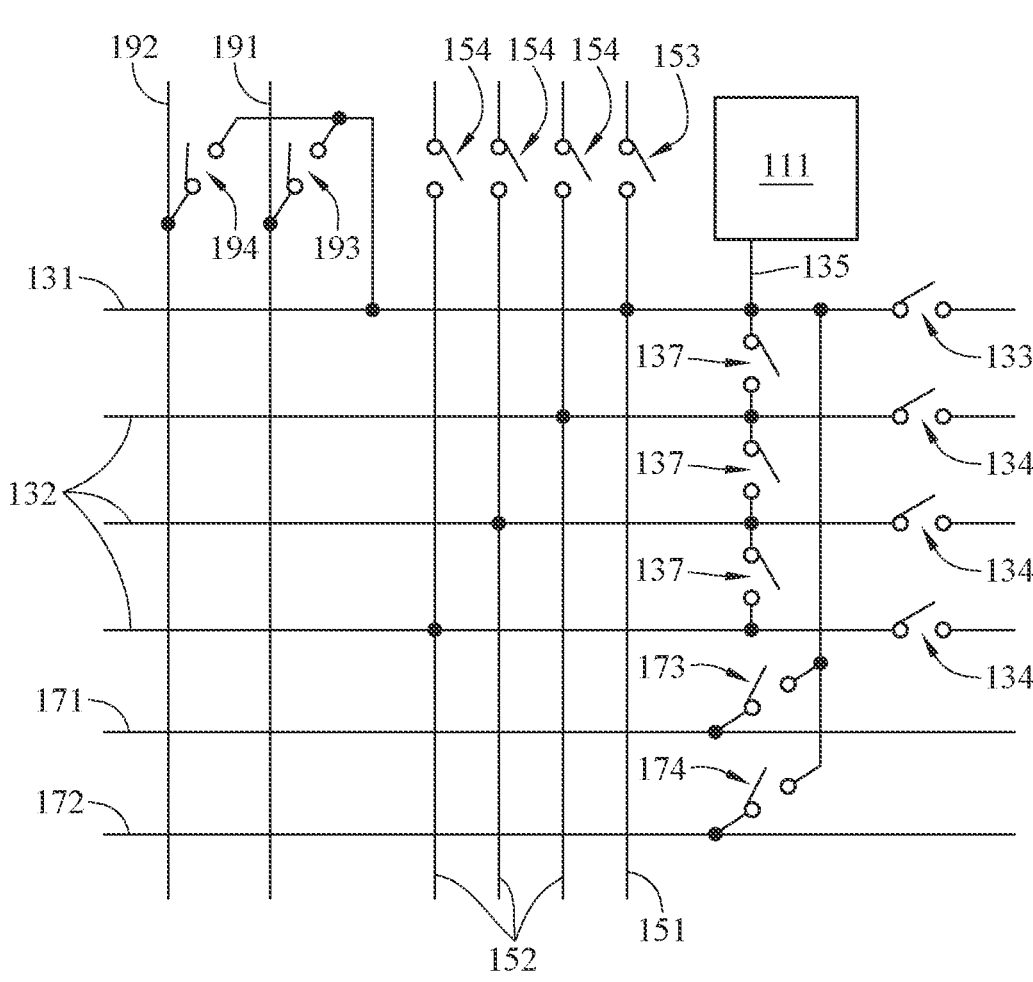
FIG. 3B is a schematic diagram illustrating a contact unit in an arrayed switch circuitry system according to yet another embodiment of the present disclosure.

Please refer to FIGS. 3A and 3B, wherein FIG. 3A is a schematic diagram illustrating a contact unit 11' in an arrayed switch circuitry system according to another embodiment of the present disclosure, and FIG. 3B is a schematic diagram illustrating a contact unit 11" in an arrayed switch circuitry system according to yet another embodiment of the present disclosure. As shown in FIGS. 3A and 3B, in addition to the pads 111, the first row channel 131, the first column channel 151, the connecting channel 135, the second row channel 171 and the second column channel 191 shown in FIG. 2, the contact unit 11'/11" further include third row channels 132, the third column channels 152, a fourth row channel 172 and a fourth column channel 192, wherein said channels may be implemented by wires. The third row channels 132 are provided with fifth switching elements 134. The third column channels 152 are respectively connected to the third row channels 132, and each of the third column channels 152 is provided with a sixth switching element 154. The fourth row channel 172 is connected to the pad 111 through a seventh switching element 174. The fourth column channel 192 is connected to the pad 111 through an eighth switching element 194.

FIGS. 3A and 3B exemplarily illustrate that the first one of the third row channel 132 is connected to the first row channel 131 through a connecting switching element 137, and other third row channels 132 are connected sequentially through other connecting switching elements 137. In other embodiments, the connecting switching element 137 may be disposed between the third column channel 152 and the first column channel 151. That is, the first one of the third column channel 152 is connected to the first column channel 151 through the connecting switching element 137, and other third column channels 152 are connected sequentially through other connecting switching elements 137. It should be noted that the numbers of the third row channels 132, the third column channels 152, the fourth row channel 172, the fourth column channel 192, the fifth switching elements 134, the sixth switching elements 154, the seventh switching element 174, the eighth switching element 194 and the connecting switching elements 137 shown in FIGS. 3A and 3B are merely examples, and not limited in the present disclosure.

In the array arranged by a number of the contact units 11'/11", each of the contact units 11'/11" has a row position and a column position. For the contact units 11'/11" with the same row position, their first row channels 131 are connected to each other, their second row channels 171 are connected to each other, their third row channels 132 are connected to each other, and their fourth row channels 172 are connected to each other. For the contact units 11'/11" with the same column position, their first column channels 151 are connected to each other, their second column channels 191 are connected to each other, their third column channels 152 are connected to each other, and their fourth column channels 192 are connected to each other.

In particular, in the array arranged by the contact units 11' shown in FIG. 3A, the first row channels 131, the first switching elements 133, the first column channels 151, the second switching elements 153, the third row channels 132, the fifth switching elements 134, the third column channels 152, the sixth switching elements 154, the connecting channels 135 and the connecting switching elements 137 of the contact units 11' may jointly form a checkerboard structure, and the second row channels 171, the third switching elements 173, the second column channels 191, the fourth switching elements 193, the fourth row channels 172, the seventh switching elements 174, the fourth column channels 192 and the eighth switching elements 194 may jointly form a high speed channel structure. In the array arranged by the contact units 11" shown in FIG. 3B, the formation of the checkerboard structure is the same as the checkerboard structure of the array arranged by the contact units 11' shown in FIG. 3A. In addition to the high speed channel structure of the array arranged by the contact units 11' shown in FIG. 3A, the high speed channel structure of the array arranged by the contact units 11" shown in FIG. 3B further includes the first row channels 131 and the connecting channels 135, wherein the connecting channel 135 is not only connected to the pad 111 and the first row channel 131, but also connected to the first row channel 131 and the third switching element 173 and seventh switching element 174.

As described above, the checkerboard structure is applicable to general signal transmission, and the high speed channel structure is applicable to signal transmission between the contact units 11'/11" spaced far apart from each other (for example, two contact units 11'/11" with more than five contact units 11'/11" placed in between), or applicable to signal transmission requiring high-speed transmission. Through integrating the checkerboard structure and the high speed channel structure, the arrayed switch circuitry system may control the connections between the contact units in any combination through control signal, and an optimal selection may be made according to the signal characteristics. In addition, the signal transmission speeds of the checkerboard structures and the high speed channel structures described in the foregoing embodiments of the present disclosure may all have excellent performance. The transmission distance is set to 20 contact units for experiment, and the experimental result may show that the transmission speed of the checkerboard structure reaches 100 Mb/s, and the transmission speed of the high speed channel structure reaches 2 Gb/s.

Figure 4:
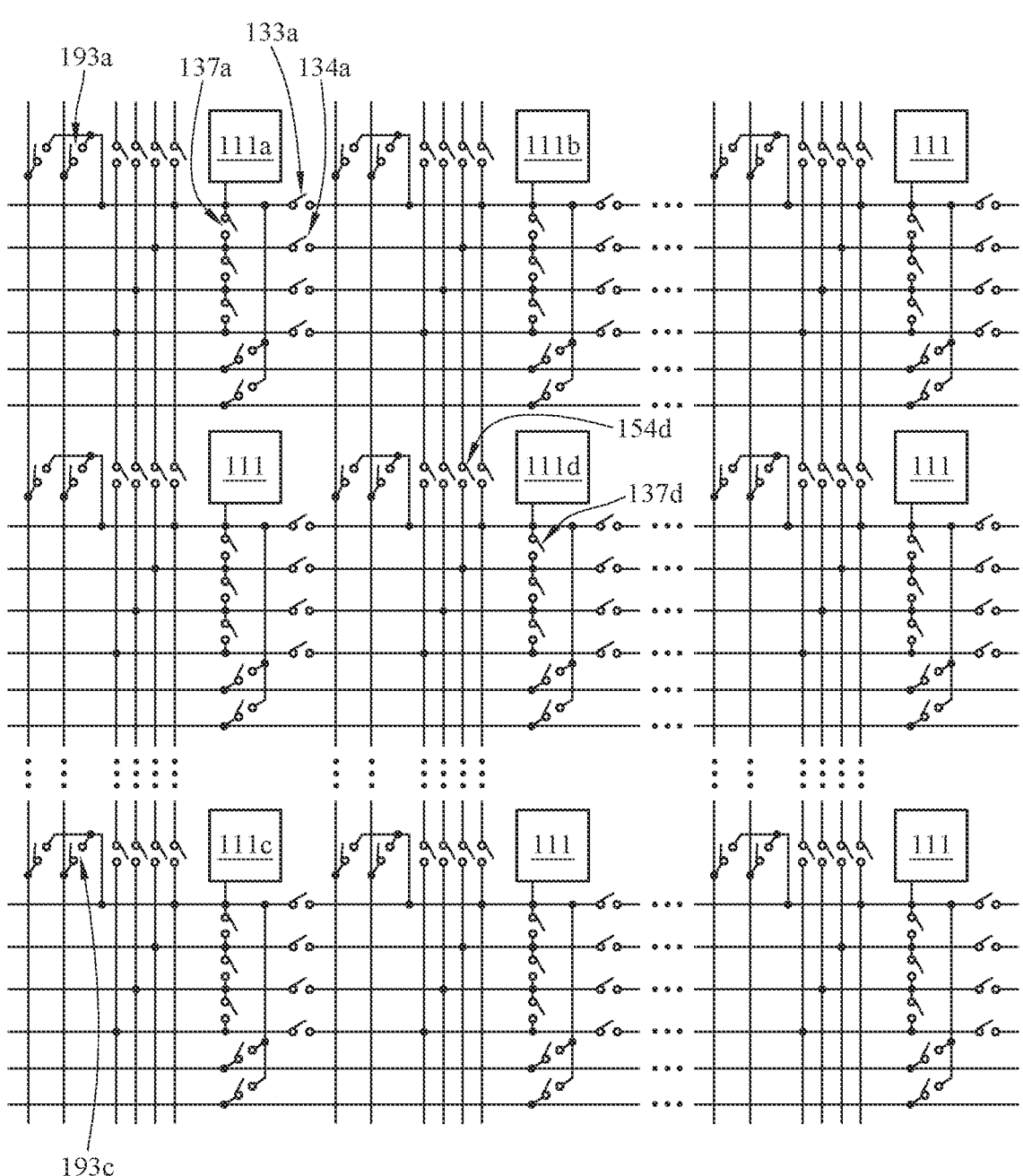
FIG. 4 is a schematic diagram of an arrayed switch circuitry system formed with the contact units in FIG. 3B.

In the following, the operation of the arrayed switch circuitry system is exemplarily described. Please refer to FIG. 4. FIG. 4 is a schematic diagram of an arrayed switch circuitry system 1' formed with the contact units 11" in FIG. 3B. For the arrayed switch circuitry system 1' shown in FIG. 4, when the requirement for wiring design is the pad 111a being electrically connected to the pad 111b, the switching element 133a may be controlled to conduct the channel between the pad 111a and the pad 111b; when the requirement for wiring design is the pad 111a being electrically connected to the pad 111c, the switching elements 193a and 193c may be controlled to conduct to conduct the channel between the pad 111a and the pad 111c; when the requirement for wiring design is the pad 111a being electrically connected to the pad 111d, the switching elements 137a, 134a, 154d and 137d may be controlled to conduct to conduct the channel between the pad 111a and the pad 111d.

Figure 5:
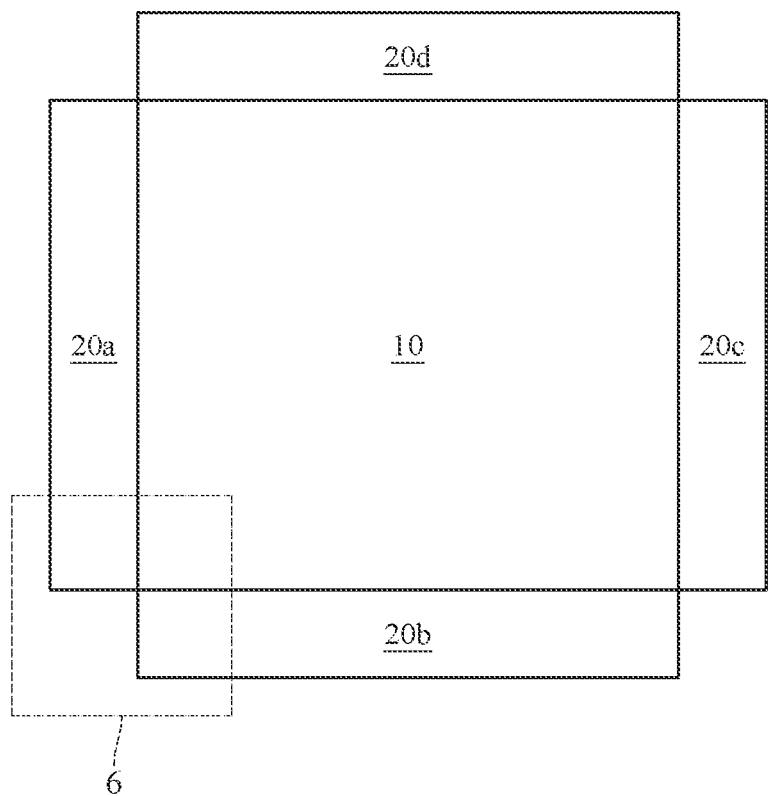
FIG. 5 is a schematic diagram illustrating an arrayed switch circuitry system according to yet one other embodiment of the present disclosure.
Figure 6:
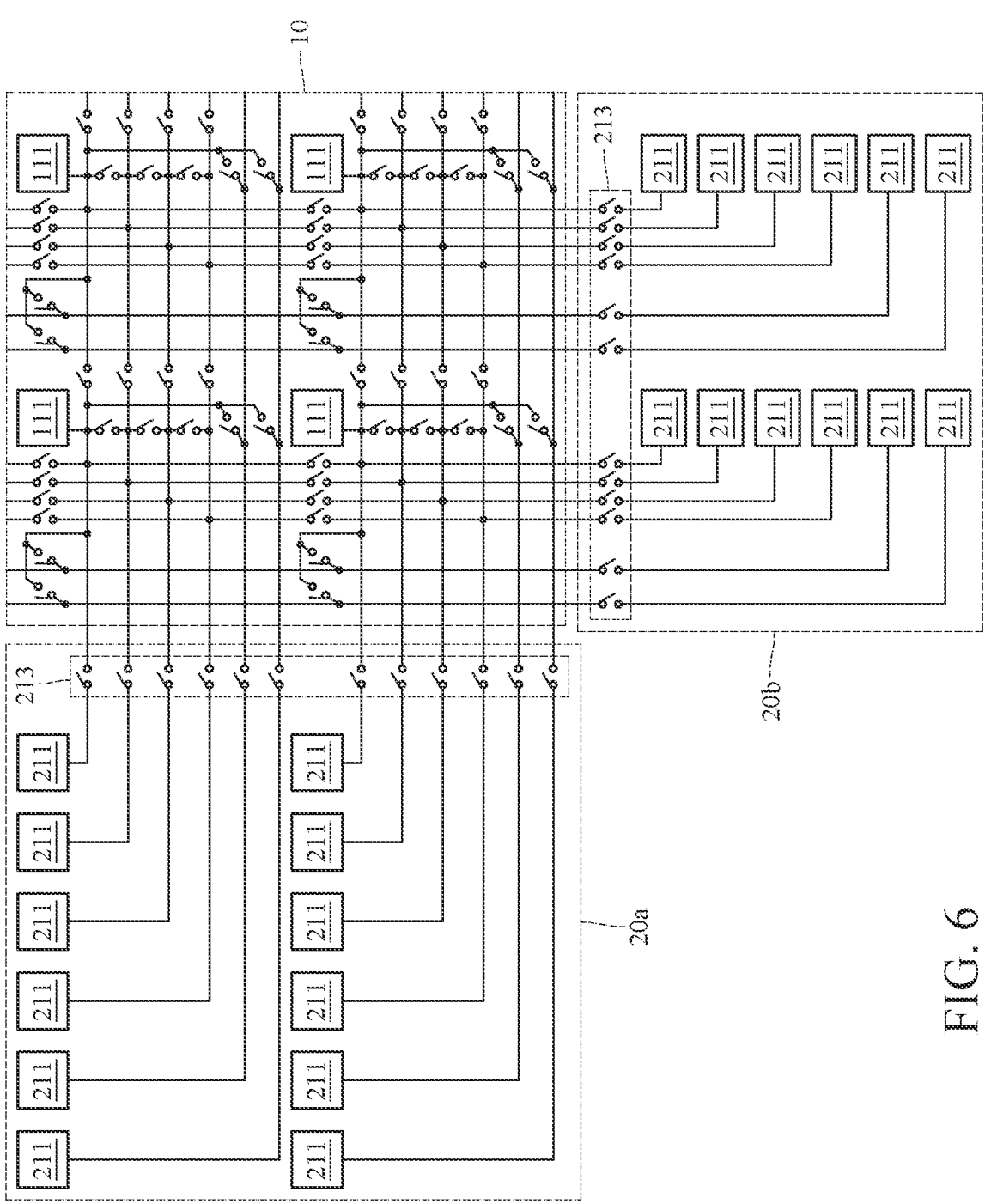
FIG. 6 is a schematic diagram of partial area of the arrayed switch circuitry system illustrated in FIG. 5.

Please refer to FIG. 5, wherein FIG. 5 is a schematic diagram illustrating an arrayed switch circuitry system 1" according to yet one other embodiment of the present disclosure. As shown in FIG. 5, the arrayed switch circuitry system F' includes an array area 10 and extension pin areas 20a, 20b, 20c and 20d respectively connected to four sides of the array area 10, wherein the array area 10 is provided with the array formed with the contact units, each of the extension pin areas 20a, 20b, 20c and 20d is provided with a number of extension pads connected to the contact units at the sides of the array respectively through a number of wire lines and a number of extension switching elements. It should be noted that FIG. 5 exemplarily illustrates four sides of the array area 10 being provided with the extension pin areas 20a, 20b, 20c and 20d, however, in other embodiments, only one to three of the extension pin areas 20a, 20b, 20c and 20d may be disposed. Further, please refer to both FIGS. 5 and 6, wherein FIG. 6 is a schematic diagram of partial area 6 of the arrayed switch circuitry system F' illustrated in FIG. 5. As shown in FIG. 6, the array area 10 is provided with the array formed of the contact units 11" shown in FIG. 3B, but is merely an example. The array area 10 may be provided with the array formed of the contact units 11 shown in FIG. 2 or the contact units 11' shown in FIG. 3A. Each of the extension pin areas 20a and 20b is provided with a number of extension pads 211 and includes a switching group 213 of a number of the extension switching elements. The extension pads 211 are connected to respective channel groups of the contact units 11" at the sides of the array through the switching group 213.

Take the extension pin area 20a as an example, the channel group is composed of a row channel group of the contact units 11", meaning the channel group is composed of the first row channel, the second row channel, the third row channel and the fourth row channel described above. Take the extension pin area 20b as an example, the channel group is composed of a column channel group of the contact units 11", meaning the channel group is composed of the first column channel, the second column channel, the third column channel and the fourth column channel. The structures of the extension pin areas 20c and 20d are respectively symmetrical to the structures of the extension pin areas 20a and 20b, and the descriptions thereof are not repeated herein. As described above, the contact units disposed in the array area 10 may also be the contact units 11 shown in FIG. 2, and in this embodiment, the channel group connected to the channel group of the extension pin areas 20a and 20c is composed of the first row channel and the second row channel, the channel group connected to the extension pin areas 20b and 20d is composed of the first column channel and the second column channel. That is, the number of extension pads 211 and the number of extension switching elements in the extension pin areas 20a and 20c are the same as the number of row channels in the array area 10, and the number of extension pads 211 and the number of extension switching elements in the extension pin areas 20b and 20d are the same as the number of column channels in the array area 10. Accordingly, each signal path has an independent extension pin, and has the characteristic of independent connection.

Through the structure of one or more of the extension pin areas 20a-20d, a number of connecting chip each provided with the arrayed switch circuitry system 1″ may be connected to each other to implement input/output (110) connection in a cross-chip manner. for example, the extension pads 211 in the extension pin area 20a of one arrayed switch circuitry system 1″ may be connected to the extension pads 211 in the extension pin area 20c of another arrayed switch circuitry system 1″; the extension pads 211 in the extension pin area 20b of one arrayed switch circuitry system 1″ may be connected to the extension pads 211 in the extension pin area 20d of another arrayed switch circuitry system 1″. In addition, through the placement of the switching group 213 in the extension pin area 20a-20d, a combination of a number of the arrayed switch circuitry systems 1″ may be controlled to activate the function of cross-chip signal transmission according to requirement, which has great design flexibility.

In particular, the switching element in the arrayed switch circuitry system of any one of the embodiments described above may be controlled by an external controlling device (such as microcontroller), or, the arrayed switch circuitry system may further include a memory connected to the control end of the respective switching element. The memory is, for example, nonvolatile memory such as read-only memory, flash memory etc. that may store the control signal written by the external controlling device (such as microcontroller) to control the on/off state of the switching element, and may read and record the on/off state of each switching element. In an embodiment, the external controlling device described above may be included in the arrayed switch circuitry system.

Figure 7:
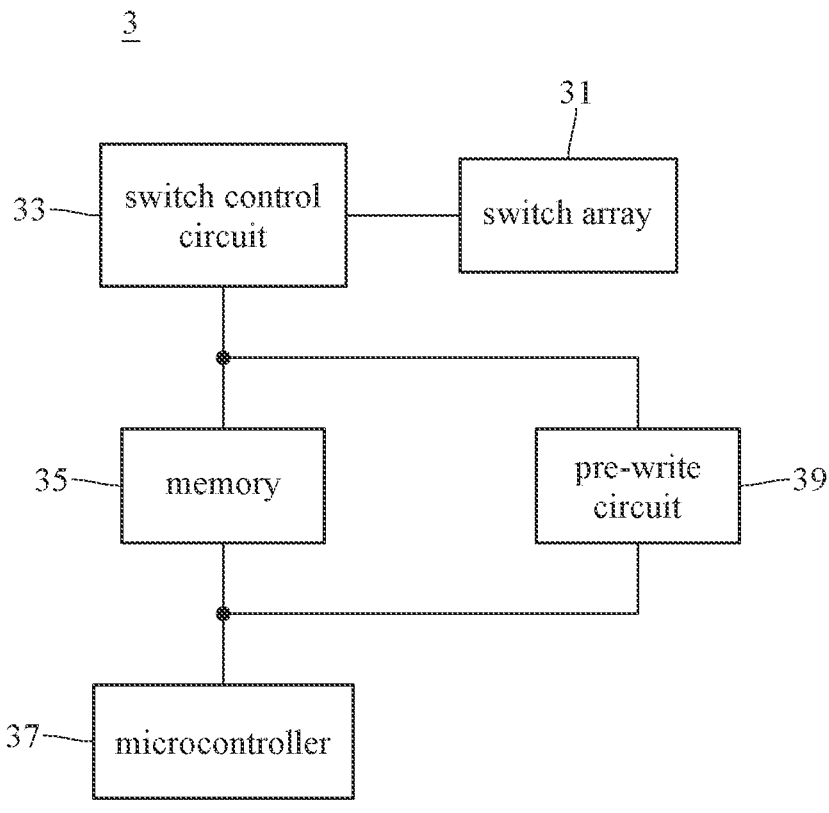
FIG. 7 is a functional diagram illustrating an arrayed switch circuitry system according to yet another embodiment of the present disclosure.

Please refer to FIG. 7. FIG. 7 is a functional diagram illustrating an arrayed switch circuitry system according to yet another embodiment of the present disclosure. As shown in FIG. 7, the arrayed switch circuitry system 3 includes a switch array 31, a switch control circuit 33, a memory 35, a microcontroller 37 and a pre-write circuit 39, wherein the switch control circuit 33 is connected to the switch array 31, the memory 35 is connected to the switch control circuit 33 and the microcontroller 37, and the microcontroller 37 is not only connected to the switch control circuit 33 through the memory 35, but also connected to the switch control circuit 33 through the pre-write circuit 39 (not through the memory 35). Further, the memory 35 may be connected to the control end of the switching element in the switch array 31 through the switch control circuit 33, and the microcontroller 37 may be connected to the control end of the switching element in the switch array 31 through the switch control circuit 33. It should be noted that FIG. 7 exemplarily shows the connection between elements/circuits of the arrayed switch circuitry system 3 in a single line, and is not intended to limit the number of connecting lines between elements/circuits.

The switch array 31 may be an array composed of any one or more types of contact units described in the embodiments, or may include the array area and the extension pin area described in the embodiment of FIG. 5. The switch control circuit 33 may receive control signal from the memory 35 or the microcontroller 37 and control the switching element in the switch array 31 accordingly. For example, the switch control circuit 33 may include D-flip flop, decoder, SR-flip flop or other controlling element, and the circuit configuration of the switch control circuit 33 may be designed by a person having ordinary skill in the art based on their needs, and the present disclosure is not limited thereto. The memory 35 may be a one-time programmable (OTP) memory or multiple-times programmable (MTP) memory. The microcontroller 37 is configured to write a command (for example, program code) for controlling the switch array 31 into the memory 35, for the memory 35 to control the on/off state of the switching element in the switch array 31 according to the command. The pre-write circuit 39 may include one or more wiring lines. In an implementation, before writing the command for controlling the switch array 31 into the memory 35, the microcontroller 37 may first control the switch array 31 and perform alternating current testing (AC testing) with the command through the pre-write circuit 39 and the switch control circuit 33, and write the command into the memory 35 after the AC testing is passed. Further, the pre-write operation and AC testing described above may be performed by an operator controlling the microcontroller 37.

According, for the arrayed switch circuitry system 3 using OTP memory as the memory 35, the problem of having to abandon the entire system due to directly writing the control command into the memory 35 and later finding out an error existed in the system during testing stage may be avoided, thereby reducing testing cost. In particular, the microcontroller 37 and the pre-write circuit 39 may be removed from the arrayed switch circuitry system 3 after the control command is written into the memory 35.

Figure 8:
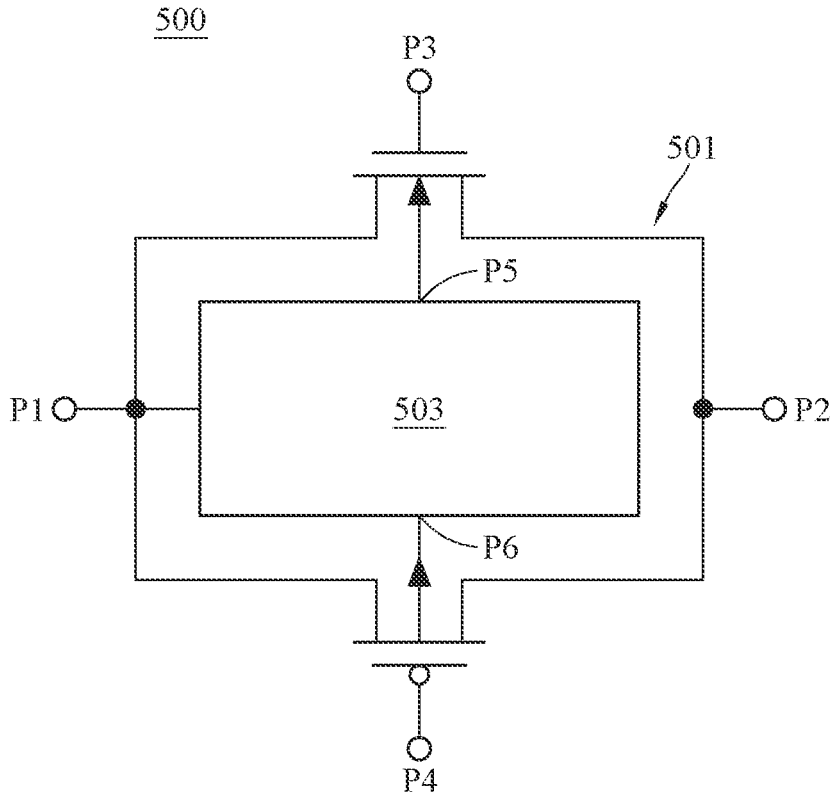
FIG. 8 is a schematic diagram illustrating switching circuit according to an embodiment of the present disclosure.

The present disclosure also provides a switching circuit having circuit capable of performing base voltage controlling and adapted to any switching element in the embodiments described above. That is, any switching element in the embodiments described above may be implemented by this switching circuit. The following describes the embodiment of this switching circuit. Please refer to FIG. 8. FIG. 8 is a schematic diagram illustrating switching circuit according to an embodiment of the present disclosure. As shown in FIG. 8, the switching circuit 500 includes a first transmission gate (transmission gate) 501 and a base voltage control sub-circuit 503. The first transmission gate 501 has a first input end P1, a first output end P2, two gate control ends P3 and P4 and two base control ends P5 and P6, and the first transmission gate 501 is configured to make the first input end P1 and the first output end P2 to conduct or not conduct with each other according to voltages of the first gate control ends P3 and P4. The base voltage control sub-circuit 503 is connected to the first input end P1 and the base control ends P5 and P6, and is configured to adjust the voltages of the base control ends P5 and P6 according to the voltage of the first input end P1 for a voltage difference between the first input end P1 and any one of the two base control ends P5 and P6 is smaller than a default value, particularly, for the voltage difference to be equal to 0.

Figure 9:
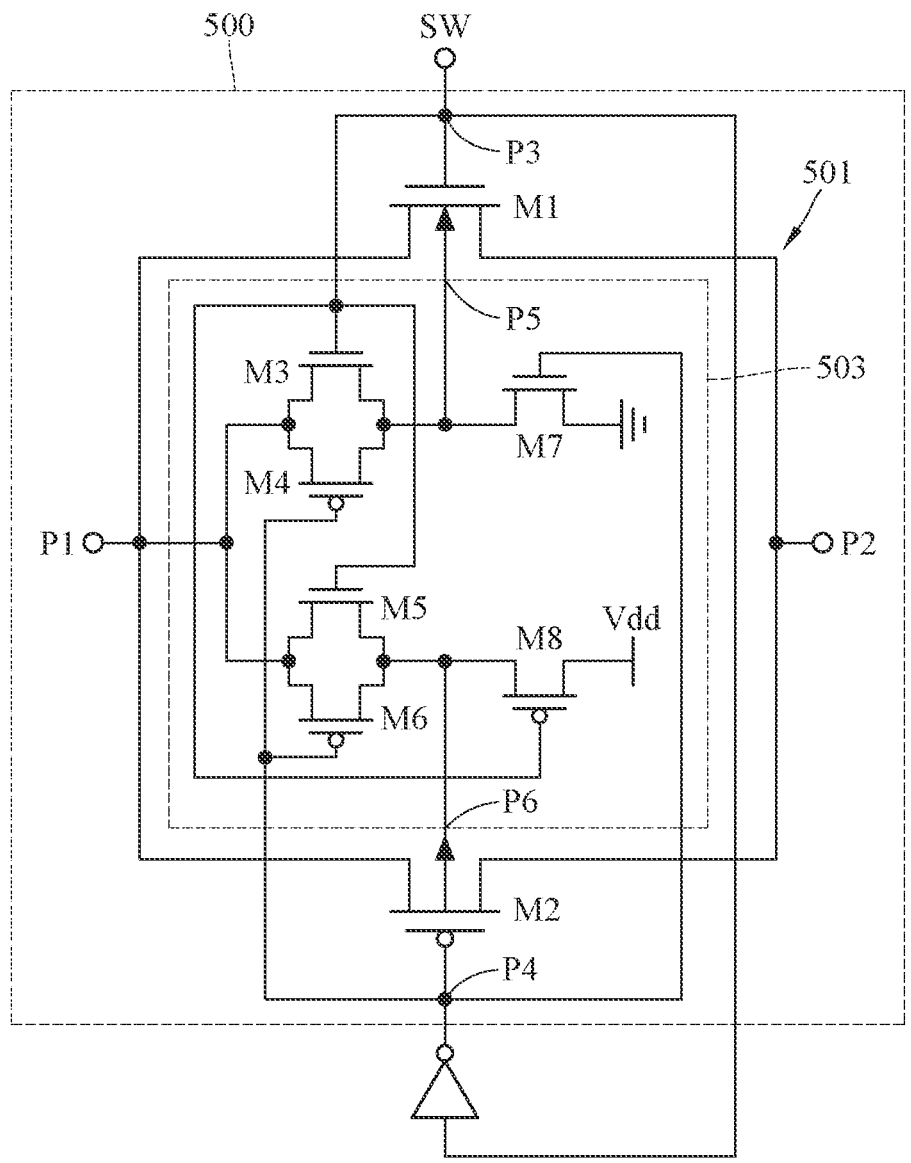
FIG. 9 is a circuit diagram illustrating a switching circuit according to an embodiment of the present disclosure.

The following further describes the circuit structure of the switching circuit 500. Please refer to FIG. 9. FIG. 9 is a circuit diagram illustrating a switching circuit 500 according to an embodiment of the present disclosure. As shown in FIG. 9, the switching circuit 500 includes the transistors M1-M8, wherein the transistors M1 and M2 constitute the first transmission gate 501, and the transistors M3-M8 constitute the base voltage control sub-circuit 503. The drain of the transistor M1 and the source of the transistor M2 are connected to each other to serve as the first input end P1, the source of the transistor M1 and the drain of the transistor M2 are connected to each other to serve as the first output end P2, the gates of the transistors M1 and M2 respectively serve as the first gate control ends P3 and P4, and the bases of the transistors M1 and M2 respectively serve as the base control ends P5 and P6. The first gate control ends P3 and P4 of the first transmission gate 501 may be connected to an external controlling circuit to be controlled by this external controlling circuit for controlling/storing the on/off state of the transistors M1 and M2. Wherein, said external controlling circuit may include the flip flop shown in FIG. 9 and the memory described above, the memory may be connected to a control end SW (that is, the first gate control ends P3 of the first transmission gate 501) of the switching circuit 500 to perform writing/reading operation, that is, controlling/storing the on/off state of the switching circuit 500, but the present disclosure is not limited thereto. For example, when the voltage of the first gate control end P3 is 1.5V and the voltage of the first gate control end P4 is 0V, the switching circuit 500 is in on (ON) state; when the voltage of the first gate control end P3 is 0V and the voltage of the first gate control end P4 is 1.5V, the switching circuit 500 is in off (OFF) state.

The base voltage control sub-circuit 503 includes a second transmission gate constituted by the transistors M3 and M4, a third transmission gate constituted by the transistors M5 and M6 and the first transistor M7 and the second transistor M8. The second transmission gate has two input ends, the second output end and two gate control ends. Wherein, the drain of the transistor M3 and the source of the transistor M4 are connected to each other to serve as a second input end, connected to the first input end P1 of the first transmission gate 501; the source of the transistor M3 and the drain of the transistor M4 are connected to each other to serve as the second output end, connected to the base control end P5; gates of the transistors M3 and M4 respectively serve as the two gate control ends, and are respectively connected to the first gate control ends P3 and P4. The third transmission gate has a third input end, the third output end and two third gate control ends. Wherein, the drain of the transistor M5 and a source of the transistor M6 are connected to each other to serve as the third input end, connected to the first input end P1 of the first transmission gate 501; the source of the transistor M5 and the drain of the transistor M6 are connected to each other to serve as a third output end, connected to the base control end P6; the gates of the transistors M5 and M6 respectively serve as the two third gate control ends, and are respectively connected to the first gate control ends P3 and P4.

The first transistor M7 has a fourth input end, a fourth output end and a fourth control end. Wherein, the fourth input end is the drain of the first transistor M7, connected to the second output end of the second transmission gate and the base control end P5 of the first transmission gate 501; the fourth output end serves as the source of the first transistor M7 for connecting to the lowest potential (ground voltage); the fourth control end is the gate of the first transistor M7, connected to the first gate control end P4 of the first transmission gate 501. The second transistor M8 has a fifth input end, a fifth output end and a fifth control end, wherein the fifth input end is the source of the second transistor M8 for receiving the highest potential (operating voltage Vdd); the fifth output end is the drain of the second transistor M8, connected to the third output end of the third transmission gate and the base control end P6 of the first transmission gate 501; the fifth control end is the gate of the second transistor M8, connected to the first gate control end P3 of the first transmission gate 501.

It should be noted that the embodiment of FIG. 9 uses N-channel metal-oxide-semiconductor field-effect transistors (MOSFET) to implement the transistors M3, M5 and M7 in the base voltage control sub-circuit 503, and uses P-channel MOSFETs to implement the transistors M4, M6 and M8 for description, but the present disclosure is not limited thereto.

With the above-described circuit structure, the base voltage control sub-circuit 503 may dynamically adjust the base voltages of two transistors of the first transmission gate 501 according to the on/off state of the first transmission gate 501. Further, when the first transmission gate 501 is in on state, the base voltage control sub-circuit 503 makes the base voltages and voltages of the input signals of the transistors M1 and M2 of the first transmission gate 501 to synchronize (less than a default value, or even equal to 0). As the critical voltage equation (1) of the transistors shown below, when the source voltage is higher than the base voltage for the voltage difference Vsb to be a positive number, the critical voltage Vth increases; as the transistor current equation (2) shown below, when the critical voltage Vth increases, the drain current Id decreases, at this time the drain voltage Vd does not change, a switch on-state resistance Ron increases. That is, for general transmission gate switch, a problem of increase in the switch on-state resistance occurs due to voltage difference between the base voltage and the input signal voltage.

$$V_{th} = V_{t0} + r\left(\sqrt{|-2\varphi_f + V_{sb}|} - \sqrt{|2\varphi_f|}\right) \tag{1}$$

$$I_d = \frac{1}{2}\mu_n C_{ox}\left(\frac{W}{L}\right)(V_{gs} - V_{th})^2 = \frac{V_d}{R_{on}} \tag{2}$$

In comparison, the switching circuit 500 of the present embodiment, through the above-mentioned structure to synchronize the base voltage with the input signal voltage, the increase in the critical voltage Vth may be reduced, or the increase in the critical voltage Vth may be avoided, thereby having lower switch on-state resistance Ron. Further, it may be known from the following time constant equation (3) that when the switch on-state resistance decreases, the charging and discharging speed of the transistor increases, thereby increasing channel bandwidth. That is, the switching circuit provided by the present disclosure may solve the problem of increase in the switch on-state resistance caused by voltage difference between the base voltage and the input signal voltage of the general transmission gate switch when being in on state. Therefore, the switching circuit provided by the present disclosure has lower switch on-state resistance, and thereby has wider channel bandwidth.

$$\tau = RC \tag{3}$$

In addition, when the first transmission gate 501 is in off state, the base voltage control sub-circuit 503 adjusts the base voltages of the transistors M1 and M2 of the first transmission gate 501 respectively to the working voltage and the ground voltage, thereby avoiding the problem of current leakage at base end. In addition, the area occupied by the wires of the switching circuit 500 on the circuit may be close to that of the general transmission gate. That is, the switching circuit 500 is superior to the general transmission gate switch in characteristics and the occupied area is equivalent to the general transmission gate switch, which has advantages in comparison.

Through the above described structure, the arrayed switch circuitry system disclosed by the present disclosure integrates two types of structures, which are the checkerboard structure and the high speed channel structure, an optimal selection may be made according to the signal characteristics, and may be applicable to the system packaging. Through controlling the on/off state of the switching element to jointly form different wiring combinations with the wiring redistribution layer, the wiring redistribution layer no longer needs to be customized, and the situation of redesigning the wiring redistribution layer during research-and-development process may be avoided, thereby reducing the research-and-development time and research-and-development cost. In addition, the switching circuit disclosed by the present disclosure has the sub-circuit for dynamically tracking input signal voltage to control the base voltage, which may have wider channel bandwidth comparing to general transmission gate.

What is claimed is:

1. An arrayed switch circuitry system, comprising a plurality of contact units arranged as an array, wherein each of the contact units comprises:

a pad;

a first row channel provided with a first switching element;

a first column channel connected to the first row channel and provided with a second switching element;

a connecting channel connected the pad to the first row channel or the first column channel;

a second row channel connected to the pad through a third switching element; and a second column channel connected to the pad through a fourth switching element;

wherein the first row channel of each of the contact units with the same row position is connected to each other, the second row channel of each of the contact units with the same row position is connected to each other, the first column of each of the contact units with the same column position is connected to each other, and the second column channel of each of the contact units with the same column position is connected to each other, wherein at least one of the first switching element, the second switching element, the third switching element and the fourth switching element comprises:

a transmission gate comprising an input end, an output end, two gate control ends and two base control ends, and configured to make the input end and the output end conduct or not conduct with each other according to voltages of the two gate control ends; and a base voltage control sub-circuit connected to the input end and the two base control ends, and configured to adjust voltages of the two base control ends according to a voltage of the input end when the input end and the output end conduct with each other, for a voltage difference between the input end and the two base control ends to be smaller than a default value, wherein the transmission gate is constituted of two transistors, a source of one of the two transistors and a drain of the other of the two transistors are directly connected to each other to serve as the input end, and a drain of said one of the two transistors and a source of said the other of the two transistors are directly connected to each other to serve as the output end, wherein the transmission gate is a first transmission gate, the input end is a first input end, the output end is a first output end, the two gate control ends are two first gate control ends, and the base voltage control sub-circuit comprises:

a second transmission gate having a second input end, a second output end and two second gate control ends, wherein the second input end is connected to the first input end, the second output end is connected to a first one of the two base control ends, and the two second gate control ends are respectively connected to the two first gate control ends;

a third transmission gate having a third input end, a third output end and two third gate control ends, wherein the third input end is connected to the first input end, the third output end is connected to a second one of the two base control ends, and the two third gate control ends are respectively connected to the two first gate control ends;

a first transistor having a fourth input end, a fourth output end and a fourth control end, wherein the fourth input end is connected to the second output end, the fourth output end is grounded, and the fourth control end is connected to a first one of the two first gate control ends; and a second transistor having a fifth input end, a fifth output end and a fifth control end, wherein the fifth input end is configured to receive an operating voltage, the fifth output end is connected to the third output end, and the fifth control end is connected to a second one of the two first gate control ends, wherein the two transistors of the first transmission gate are a N-channel metal-oxide-semiconductor field-effect transistor (MOSFET) and a P-channel MOSFET, each of the second transmission gate and the third transmission gate is constituted of a N-channel MOSFET and a P-channel MOSFET, gates of the N-channel MOSFETs are connected with each other, gates of the P-channel MOSFETs are connected with each other, a base of the N-channel MOSFET included in the first transmission gate serves as the first one of the two base control ends, a gate of the N-channel MOSFET of the first transmission gate serves as the second one of the two first gate control ends, a base of the P-channel MOSFET included in the first transmission gate serves as the second one of the two base control ends, and a gate of the P-channel MOSFET of the first transmission gate serves as the first one of the two first gate control ends.

2. The arrayed switch circuitry system according to claim 1, wherein each of the contact units further comprises:

a third row channel provided with a fifth switching element;

a third column channel connected to the third row channel and provided with a sixth switching element;

a fourth row channel connected to the pad through a seventh switching element; and a fourth column channel connected to the pad through an eighth switching element;

wherein the third row channel is connected to the first row channel through a connecting switching element, or the third column channel is connected to the first column channel through the connecting switching element;

wherein the third row channel of each of the contact units with the same row position is connected to each other, the fourth row channel of each of the contact units with the same row position is connected to each other, the third column of each of the contact units with the same column position is connected to each other, and the fourth column channel of each of the contact units with the same column position is connected to each other.

3. The arrayed switch circuitry system according to claim 1, further comprising:

a plurality of extension pads connected to a channel group of each of contact units located at one side of the array among the contact units through a plurality of extension switching elements respectively;

wherein the channel group is composed of the first row channel and the second row channel, or is composed of the first column channel and the second column channel.

4. The arrayed switch circuitry system according to claim 2, further comprising:

a plurality of extension pads connected to a channel group of each of contact units located at one side of the array among the contact units through a plurality of extension switching elements respectively;

wherein the channel group is composed of the first row channel, the second row channel, the third row channel and the fourth row channel, or is composed of the first column channel, the second column channel, the third column channel and the fourth column channel.

5. The arrayed switch circuitry system according to claim 1, further comprising a memory connected to a plurality of control ends of the first switching element, the second switching element, the third switching element and the fourth switching element, wherein the memory is configured to control and record switching status of the first switching element, the second switching element, the third switching element and the fourth switching element.

6. The arrayed switch circuitry system according to claim 1, further comprising:

a memory connected to a plurality of control ends of the first switching element, the second switching element, the third switching element and the fourth switching element; and a microcontroller connected to the memory and the control ends, the microcontroller configured to control the control ends and perform an alternating current testing according to a control command, and write the control command into the memory after the alternating current testing is passed.

7. A switching circuit, comprising:

a transmission gate having an input end, an output end, two gate control ends and two base control ends, and configured to make the input end and the output end conduct or not conduct with each other according to voltages of the two gate control ends; and a base voltage control sub-circuit connected to the input end and the two base control ends, and configured to adjust voltages of the two base control ends according to a voltage of the input end when the input end and the output end conduct with each other, for a voltage difference between the input end and the two base control ends to be smaller than a default value, wherein the transmission gate is constituted of two transistors, a source of one of the two transistors and a drain of the other of the two transistors are directly connected to each other to serve as the input end, and a drain of said one of the two transistors and a source of said the other of the two transistors are directly connected to each other to serve as the output end, wherein the transmission gate is a first transmission gate, the input end is a first input end, the output end is a first output end, the two gate control ends are two first gate control ends, and the base voltage control sub-circuit comprises:

a second transmission gate having a second input end, a second output end and two second gate control ends, wherein the second input end is connected to the first input end, the second output end is connected to a first one of the two base control ends, and the two second gate control ends are respectively connected to the two first gate control ends;

a third transmission gate having a third input end, a third output end and two third gate control ends, wherein the third input end is connected to the first input end, the third output end is connected to a second one of the two base control ends, and the two third gate control ends are respectively connected to the two first gate control ends;

a first transistor having a fourth input end, a fourth output end and a fourth control end, wherein the fourth input end is connected to the second output end, the fourth output end is grounded, and the fourth control end is connected to a first one of the two first gate control ends; and a second transistor having a fifth input end, a fifth output end and a fifth control end, wherein the fifth input end is configured to receive an operating voltage, the fifth output end is connected to the third output end, and the fifth control end is connected to a second one of the two first gate control ends, wherein the two transistors of the first transmission gate are a N-channel metal-oxide-semiconductor field-effect transistor (MOSFET) and a P-channel MOSFET, each of the second transmission gate and the third transmission gate is constituted of a N-channel MOSFET and a P-channel MOSFET, gates of the N-channel MOSFETs are connected with each other, gates of the P-channel MOSFETs are connected with each other, a base of the N-channel MOSFET included in the first transmission gate serves as the first one of the two base control ends, a gate of the N-channel MOSFET of the first transmission gate serves as the second one of the two first gate control ends, a base of the P-channel MOSFET included in the first transmission gate serves as the second one of the two base control ends, and a gate of the P-channel MOSFET of the first transmission gate serves as the first one of the two first gate control ends.

* * * * *